United States Patent
Koerner et al.

(10) Patent No.: US 11,744,047 B2
(45) Date of Patent: Aug. 29, 2023

(54) AIR ENERGY STORAGE POWERED UNINTERRUPTIBLE POWER SUPPLY

(71) Applicant: Caeli, LLC, Dallas, TX (US)

(72) Inventors: Matthew Douglas Koerner, Ashburn, VA (US); Brandon McDaniel, Flower Mound, TX (US); John A. Musilli, Jr., San Diego, CA (US)

(73) Assignee: Caeli, LLC, Dallas, TX (US)

( * ) Notice: Subject to any disclaimer, the term of this patent is extended or adjusted under 35 U.S.C. 154(b) by 0 days.

(21) Appl. No.: 17/652,074

(22) Filed: Feb. 22, 2022

(65) Prior Publication Data

US 2022/0272871 A1     Aug. 25, 2022

Related U.S. Application Data

(60) Provisional application No. 63/152,755, filed on Feb. 23, 2021.

(51) Int. Cl.
*G06F 1/16*          (2006.01)
*H05K 5/00*       (2006.01)
(Continued)

(52) U.S. Cl.
CPC .......... *H05K 7/20718* (2013.01); *F02C 6/16* (2013.01); *G06F 1/20* (2013.01); *G06F 1/30* (2013.01);
(Continued)

(58) Field of Classification Search
CPC ............. H05K 7/20718; H05K 7/208; H05K 7/20836; H05K 7/20754; H05K 7/20709;
(Continued)

(56) References Cited

U.S. PATENT DOCUMENTS

| | | | |
|---|---|---|---|
| 2007/0022755 A1* | 2/2007 | Pinkerton | F24F 5/0085 |
| | | | 60/646 |
| 2008/0030078 A1* | 2/2008 | Whitted | H02J 9/061 |
| | | | 307/66 |

(Continued)

OTHER PUBLICATIONS

MAN Energy Solutions, Urban Energy, https://www.man-es.com/docs/default-source/energy-storage/man-es_I2-broch_urban-energy_preview.pdf?sfvrsn=e9be4f6d_18, 86224 Augsburg, Germany. 32 pgs.

(Continued)

*Primary Examiner* — Anthony M Haughton

(57) ABSTRACT

A system includes at least one storage tank configured to store at least one of first compressed air or liquid air. The system also includes a power supply system comprising a turbine, a generator, and a flywheel. The power supply system is configured to receive second compressed air from the at least one storage tank, wherein the second compressed air comprises either the first compressed air or the liquid air which has been heated into a gaseous state; spin the turbine and the flywheel using the second compressed air, wherein the spinning of the turbine generates electrical energy at the generator; provide the electrical energy to a data center for powering electronic devices of the data center; and provide at least a portion of the second compressed air exhausted by the turbine to the data center for cooling the electronic devices of the data center.

20 Claims, 6 Drawing Sheets

(51) Int. Cl.
| | |
|---|---|
| H05K 7/00 | (2006.01) |
| H05K 7/20 | (2006.01) |
| F02C 6/16 | (2006.01) |
| G06F 1/20 | (2006.01) |
| G06F 1/30 | (2006.01) |

(52) U.S. Cl.
CPC ......... *H05K 7/208* (2013.01); *F05D 2210/13* (2013.01); *F05D 2220/60* (2013.01); *F05D 2220/76* (2013.01); *F05D 2260/205* (2013.01); *F05D 2260/43* (2013.01); *F05D 2270/42* (2013.01); *G06F 2200/201* (2013.01)

(58) Field of Classification Search
CPC ...... G06F 1/20; G06F 1/30; F02C 6/16; F02C 6/14
See application file for complete search history.

(56) References Cited

U.S. PATENT DOCUMENTS

| | | | |
|---|---|---|---|
| 2010/0329903 A1* | 12/2010 | Fong | F03D 9/17 137/12 |
| 2011/0094242 A1 | 4/2011 | Koerner | |
| 2011/0115223 A1* | 5/2011 | Stahlkopf | H02P 9/04 290/7 |
| 2011/0239683 A1* | 10/2011 | Czamara | H05K 7/20745 62/259.4 |
| 2013/0192216 A1* | 8/2013 | Berlin, Jr. | F02C 6/16 60/413 |
| 2019/0353056 A1* | 11/2019 | Brett | F02C 1/02 |
| 2020/0335973 A1* | 10/2020 | Ramamurthy | G06Q 50/06 |
| 2021/0313835 A1* | 10/2021 | Ramamurthy | G06Q 50/06 |

OTHER PUBLICATIONS

Highview Power, "Cyrogenic energy storage", copyright 2021, 5 pgs. https://highviewpower.com/technology/.
Linde Engineering, "Modular CO2 purification and liquefaction plants", copyright 2021, 4 pgs., https://www.linde-engineering.com/en/process-plants/co2-plants/co2-purification-and-liquefaction/modular-co2-plants/index.html.
Energy Storage Association, "Mechanical Energy Storage", copyright 2021, 5 pgs., https://energystorage.org/why-energy-storage/technologies/mechanical-energy-storage/#:~:text=Compressed%20Air%20Energy%20Storage%20(CAES,demand%20(peak%20load)%20periods.
EM Power Systems, "About IEM Power Systems", copyright 2017, 3 pgs., https://www.iemps.com/company/about-iem-power-systems.
Scribd, "Turbo Expanders For Cold Production and Energy Recovery Booklet PDF", copyright 2016, 17 pgs., https://www.scribd.com/document/452458382/Turbo-Expanders-for-cold-production-and-energy-recovery-booklet-pdf.
Hepburn, et al.,"The technological and economic prospects for CO2 utilization and removal", https://www.nature.com/articles/s41586-019-1681-6#Tab2, Nov. 6, 2019, 11 pgs.
Scribd, "HITECH PowerPRO2-2016", copyright 2016, 55 pgs., https://www.scribd.com/document/347266893/HITEC-PowerPRO2700-2016-pdf.
ScienceDirect, "Sustainable hyrdocarbon fuels by recycling CO2 and H2O with renewable or nuclear energy", copyright 2010, 3 pgs., https://www.sciencedirect.com/science/article/abs/pii/S1364032110001942?via%3Dihub.
ScienceDirect, "Production of cement-free construction blocks from industry wastes", copyright 2016, 3 pgs., https://www.sciencedirect.com/science/article/abs/pii/S0959652616311374.
Blue Planet Systems, "Permanent Carbon Capture", copyright 2021, 4 pgs., http://www.blueplanet-ltd.com/#technology.
Carbon Cure "Sustainability in Concrete Makes Good Business Sense", copyright 2021, 9 pgs., https://www.carboncure.com/concrete producers/.
Solidia, "Solidia Solutions", copyright 2021, 1 pg., https://www.solidiatech.com/solutions.html.
Calix Global, "Cement & lime", copyright 2021, 3 pgs., https://www.calix.global/industries/cement-and-lime/.
Vox, "These uses of CO2 could cut emissions—and make trillions of dollars", copyright 2019, 18 pgs., https://www.vox.com/energy-and-environment/2019/11/13/20839531/climate-change-industry-co2-carbon-capture-utilization-storage-ccu.
Forbes, "Carbon Engineering—Taking CO2 Right Out Of The Air To Make Gasoline", copyright 2019, 6 pgs., https://www.forbes.com/sites/jamesconca/2019/10/08/carbon-engineering-taking-co2-right-out-of-the-air-to-make-gasoline/?sh=370a22c813cc.
Department of Energy, "2021 Climate Adaptation and Resilience Plan", copyright 2021, 7 pgs., https://www.energy.gov.
Chart, "Bulk Storage Tanks", copyright 2021, 11 pgs., https://www.chartindustries.com/Products/Bulk-Cryogenic-Tanks.
Universal Industrial Gases, "Large Tank Specifications", copyright 2003, 2 pgs., http://www.uigi.com/largetanks.html.
Integ Systems Corporation, Brochure, copyright 2021, 4 pgs., https://www.integsystemscorp.com/pdf/Integ_Systems_Corp_Brochure.pdf.
Turbogaz, "Expander-Generator", copyright 2021, 5 pgs., https://turbogaz.com.ua/en/equipment/expander-generator.
Phoenix Equipment Corporation, "3.1 MW Steam Turbine Generator Set for Sale" 1 pg., https://www.phxequip.com/Multimedia/documents/plants/steam-turbine-generator-murray-3-1-mw-173.pdf.
Phoenix Equipment Corporation, "8 Steam Turbines & Steam Turbine Generators", copyright 2021, 7 pgs., https://www.phxequip.com/subcategory.222.0/power-generation-generators-steam-turbine-generators.aspx.
LNG Global, "WSCE Mini LNG Plants", copyright 2021, 5pgs., https://www.lngglobal.com/mini-lng-plant-overview.
MAN Energy Solutions, "MGT6000 Single Shaft", https://www.man-es.com/docs/default-source/oil-and-gas-process-industry-documents/mgt6000-1s-(single-shaft).pdf?sfvrsn=de156070_8, 86224 Augsburg, Germany, 4 pgs.
Science Based Targets, "Guidance for ICT Companies Setting Science Based Targets", https://sciencebasedtargets.org/resources/legacy/2020/04/GSMA_IP_SBT-report_WEB-SINGLE.pdf, 25 pgs.
PS&C Power, "Hybrid Rotary Uninterruptible Power Supply; Series XC", copyright 2021, 4 pgs., https://pscpower.com/large-hybrid-rotary-ups/.
SSS Gears Limited, "Power Generation", copyright 2021, 2 pgs., http://www.sssclutch.com/en/power-generation/.
Stirling Cryogenics, "Liquid Air Production Systems", copyright 2021, 4 pgs., https://www.stirlingcryogenics.eu/en/products/liquid-air-production-systems.
Calnetix Technologies, "Case Studies/The Heat to Power Solution" copyright 2021, 5 pgs., https://www.calnetix.com/system-integration/heat-power-systems.
Highview Power Storage, Inc., R. Riley, HPS-GEN01-0142, "General Technical Requirements For Liquid Air Energy Storage Facilities", Nov. 19, 2020, 11 pgs.
International Search Report and Written Opinion dated May 4, 2022 regarding Application No. PCT/US2022/070795, 7 pages.

* cited by examiner

AIR ENERGY STORAGE POWERED UNINTERRUPTIBLE POWER SUPPLY

CROSS-REFERENCE TO RELATED APPLICATIONS AND PRIORITY CLAIM

This application claims priority under 35 U.S.C. § 119(e) to U.S. Provisional Patent Application No. 63/152,755 filed on Feb. 23, 2021, which is hereby incorporated by reference in its entirety.

TECHNICAL FIELD

Embodiments of the present disclosure relate to uninterruptible power supply systems and, in particular, using air energy storage to power an uninterruptible power supply, for example, for critical power applications.

BACKGROUND

Facilities that operate power critical applications require a constant or near constant supply of electricity to ensure that its power critical applications can always be in operation. These facilities typically use a utility grid as a primary source of electricity and rely on uninterruptible power supplies to provide their applications with power in the event there is a loss of power from the primary utility grid. Uninterruptible power supplies typically generate electricity with a generator powered by a diesel motor. Diesel motors exhaust toxins that can be harmful to human health as well as the environment. Additionally, diesel motors require frequent and continued maintenance. Power critical facilities are often limited to using diesel engines in order to ensure that the facilities maintain uninterruptible power.

SUMMARY

This disclosure provides systems and methods for providing uninterruptible power and cooling from an intermittent power source for a critical power application.

In a first embodiment, a system includes at least one storage tank configured to store at least one of first compressed air or liquid air. The system also includes a power supply system comprising a turbine, a generator, and a flywheel. The power supply system is configured to receive second compressed air from the at least one storage tank, wherein the second compressed air comprises either the first compressed air or the liquid air which has been heated into a gaseous state; spin the turbine and the flywheel using the second compressed air, wherein the spinning of the turbine generates electrical energy at the generator; provide the electrical energy to a data center for powering electronic devices of the data center; and provide at least a portion of the second compressed air exhausted by the turbine to the data center for cooling the electronic devices of the data center. This can include providing at least a portion of the second compressed or liquid air cold thermal content directly to the data center through a heat exchanger disposed prior to the turbine.

In a second embodiment, a method includes storing at least one of first compressed air or liquid air in at least one storage tank. The method also includes receiving, at a power supply system comprising a turbine, a generator, and a flywheel, second compressed air from the at least one storage tank, wherein the second compressed air comprises either the first compressed air or the liquid air which has been heated into a gaseous state. The method also includes spinning the turbine and the flywheel using the second compressed air, wherein the spinning of the turbine generates electrical energy at the generator. The method also includes providing the electrical energy to a data center for powering electronic devices of the data center. The method also includes providing at least a portion of the second compressed air exhausted by the turbine to the data center for cooling the electronic devices of the data center. This can include providing at least a portion of the second compressed or liquid air cold thermal content directly to the data center through a heat exchanger disposed prior to the turbine.

In a third embodiment, a non-transitory computer readable medium embodies a computer program. The computer program comprises computer readable program code that, when executed by a processor of a computing device, cause the computing device to: control at least one storage tank to store at least one of first compressed air or liquid air in at least one storage tank; control a power supply system to receive second compressed air from the at least one storage tank, wherein the second compressed air comprises either the first compressed air or the liquid air which has been heated into a gaseous state, wherein the power supply system comprises a turbine, a generator, and a flywheel; control the power supply system to spin the turbine and the flywheel using the second compressed air, wherein the spinning of the turbine generates electrical energy at the generator; control the power supply system to provide the electrical energy to a data center for powering electronic devices of the data center; and control the power supply system to provide at least a portion of the second compressed air exhausted by the turbine to the data center for cooling the electronic devices of the data center. This can include providing at least a portion of the second compressed or liquid air cold thermal content directly to the data center through a heat exchanger disposed prior to the turbine.

Other technical features may be readily apparent to one skilled in the art from the following figures, descriptions, and claims.

DETAILED DESCRIPTION

FIGS. 1 through 6, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

For simplicity and clarity, some features and components are not explicitly shown in every figure, including those illustrated in connection with other figures. It will be understood that all features illustrated in the figures may be employed in any of the embodiments described. Omission of a feature or component from a particular figure is for purposes of simplicity and clarity and is not meant to imply that the feature or component cannot be employed in the embodiments described in connection with that figure.

Embodiments of the present disclosure recognize and take into account that in order to supplement power provided to the facilities by a primary power source, facilities have used diesel powered generators. However, the toxins released by diesel powered generators can be harmful to the people that work near the generators and to the environment. Additionally, the need for supply of fossil fuels can be costly and inefficient. Embodiments of the present disclosure recognize and take into account that facilities may not have an alternative method of ensuring uninterruptible power that rely on other sources of energy, such as renewable energy sources.

Accordingly, embodiments of the present disclosure recognize that there is a need for a steady-state power source for facilities, like data centers, that require continuous operation capacity. Additionally, embodiments of the present disclosure recognize that facilities, such as data centers, create a significant amount of heat by constantly operating the computer systems and associated electronic devices housed within the data center. Additionally, embodiments of the present disclosure recognize that there is a need for providing cooling to the facilities so that the computer systems of the facilities may operate at an desired temperature and not become overheated. Accordingly, embodiments of the present disclosure provide for uninterruptible power and cooling for critical power applications.

Figure 1:
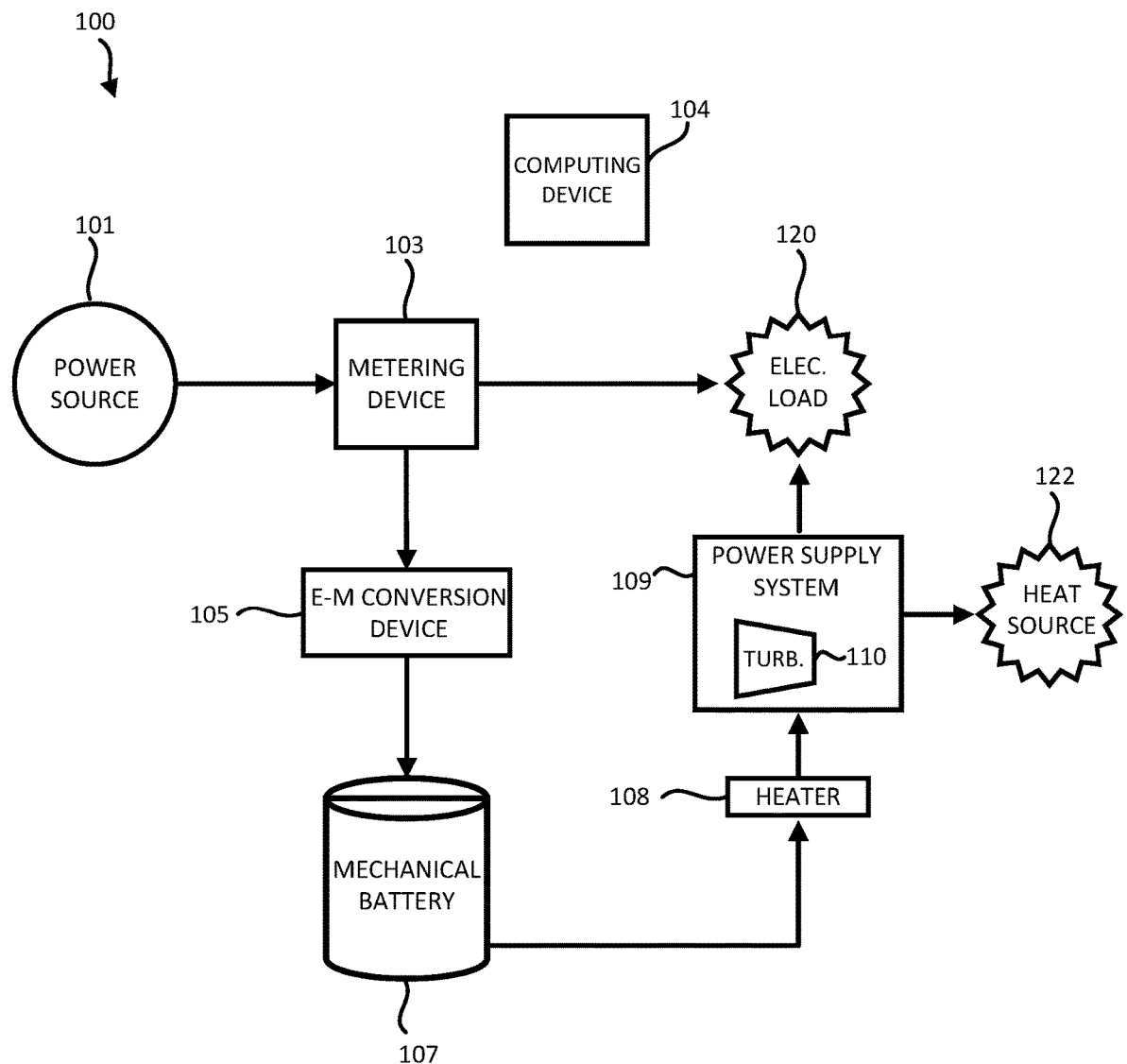
FIG. 1 illustrates an example system for air energy storage power supply and cooling according to various embodiments of the present disclosure.

FIG. 1 illustrates an example system 100 for air energy storage power supply and cooling according to various embodiments of the present disclosure. The embodiment of the system 100 shown in FIG. 1 is for illustration only. Other embodiments of the system 100 could be used without departing from the scope of this disclosure.

The system 100 may include a power source 101 that creates or receives electrical energy. The power source 101 may create or receive electrical energy from a renewable energy source. The power source 101 may create or receive electrical energy from wind power, solar power, tidal/wave power, or any other renewable energy source (the utility grid could also provide power through the same input). The system 100 may also receive electrical energy from a utility power grid. The utility power grid and the power source 101 may provide electrical energy to the system 100 through a same input of the system 100.

The system 100 may include a metering device 103. The metering device 103 may receive the electrical energy created or received by the power source 101, for example, during periods of time where the electrical energy is readily available and/or cost efficient and distribute the energy to different locations within the system 100. For example, the system 100 includes a computing device 104 to control the overall operation of the system 100. The computing device 104 may be connected to the metering device 103 and/or power source 101 to monitor the availability, reliability, and/or price of the electrical energy. For example, based on comparison of the availability, reliability, and/or price of the electrical energy to one or more baseline or threshold levels, the computing device 104 determines to convert the electrical energy for storage as potential mechanical energy. In some embodiments, the computing device 104 may be a service operated by a third party such as a person or a company. The computing device 104 may be housed and operated at a location different than the location at which the rest of system 100 is located. That is to say, the computing device 104 is not bound to a specific location.

The metering device 103 may supply electrical power to an electrical load 120. The electrical load 120 is discussed in greater detail below. The metering device 103 may supply electrical energy to an electrical-to-mechanical energy conversion device 105. The metering device may also be connected to an electricity grid to which the metering device 103 can provide electrical energy created by the power source 101 or receive electrical energy to supply to the electrical load 120 or the electrical-to-mechanical energy conversion device 105.

The electrical-to-mechanical energy conversion device 105 may receive electrical energy from the metering device 103 and convert the electrical energy to mechanical energy. For example, the electrical-to-mechanical energy conversion device 105 may comprise a gas-to-liquid conversion system. The gas-to-liquid conversion system may be configured to use electrical energy to convert a gas to a liquid. The gas-to-liquid conversion system may incorporate any known gas liquefaction system. For example, the gas-to-liquid conversion system may operate a Linde-Hampson cycle to convert gas to a liquid. The gas-to-liquid conversion system may repeatedly perform a cycle of compressing, cooling, and expanding a gas to reduce the temperature of the gas and convert the gas to a liquid. Accordingly, the gas-to-liquid conversion system may include compressors, coolers, heat exchangers, separators, expanders, and other equipment necessary for converting the gas to a liquid. The gas-to-liquid conversion system may be used to convert any of a number of gases to liquid. In various embodiments, the gas-to-liquid conversion system is used to convert ambient air of the system 100 to liquified air.

In other embodiments, the electrical-to-mechanical energy conversion device 105 may comprise an air compressor configured to use electrical energy to compress air so that it has a pressure greater than atmospheric pressure.

The electrical-to-mechanical energy conversion device 105 is not limited to a gas-to-liquid conversion system or an air compressor. Other embodiments of the electrical-to-mechanical energy conversion device 105 could be used without departing from the scope of this disclosure.

In some embodiments, the air liquefaction process can include an air separation process that separates air into at least oxygen and carbon dioxide ($CO_2$) components. The oxygen produced in the air separation process can be used as an oxidizer in a chemical element (e.g., iron (Fe)) bed to generate thermal energy that can be used for heating in the system 100. Carbon sequester in the oxidation process can create an exothermic chemical reaction in the rapidly oxidizing chemical element bed. In some embodiments, the thermal energy from the oxidation can be used in lieu of natural gas or other carbon dependent heating sources.

In some embodiments, the air separation process can include multiple phases. In one phase, the air is filtered, compressed, and passed through a molecular sieve, which removes water vapor and separates out the $CO_2$. In another phase, the $CO_2$ is captured, and the compressed air is passed into the compression system. The process may be nearly energy neutral to capture the $CO_2$ and operate the compression system. The waste stream of the $CO_2$ capture removes the energy required for the compression system to reach the second stage of compression. This, in turn, can reduce the total cost of operation of the system 100, or reduce the cost of carbon capture, or both.

The system 100 further includes a mechanical battery 107 (or mechanical energy storage device). The mechanical battery may store mechanical energy created by the electrical-to-mechanical energy conversion device 105. For example, when the electrical-to-mechanical energy conversion device 105 comprises a gas-to-liquid conversion system, the mechanical battery 107 may be an insulated container capable of containing the liquid gas generated by the gas-to-liquid conversion system. The container may be any container suitable for containing the liquified gas. The mechanical battery 107 may be a storage tank insulated and refrigerated to maintain a desired temperature of the liquid gas generated by the gas-to-liquid conversion system. In embodiments where the electrical-to-mechanical energy conversion device 105 is an air compressor, the mechanical battery 107 may be a storage tank configured to contain pressurized air. In some embodiments, the mechanical battery 107 can be a storage tank configured to contain both liquified air and compressed air. In some embodiments, the mechanical battery 107 can include one or more liquid or solid materials (e.g., liquid $CO_2$, dry ice, zeolite crystals, and the like) capable of thermochemically storing thermal energy (or cold storage) from (or for use by) the electrical-to-mechanical energy conversion device 105. Other embodiments of the mechanical battery 107 could be used without departing from the scope of this disclosure.

The system 100 may include a heater or heat exchanger 108 (hereinafter referred to simply as "heater"). The heater 108 may heat the air delivered to the heater 108 from the mechanical battery 107. For example, in embodiments where the mechanical battery 107 stores liquified air, the heater 108 may heat the liquified air from the mechanical battery 107 to gasify the liquified air back to a gaseous state. The heater 108 is configured to make the system 100 more efficient by improving the gasification of the liquified air from the battery 107 prior to the air entering a power supply system 109. In various embodiments, a heater 108 may not be required for the gasification of the liquified air stored in the battery 107. In these embodiments, atmospheric heat acting on the liquified air as the liquified air travel from the battery 107 to the power supply system 109 may be enough to convert the liquified air to a gaseous state. For example, liquified air may be stored in the battery 107 below the temperature at which liquified air converts to its gaseous state (e.g., approximately −320 degrees Fahrenheit at or near atmospheric pressure). The heat from surround ambient air can convert liquified air to its gaseous state. In this example, the heater 108 is configured to accelerate the conversion of liquified gas from a liquid to a gas. Accordingly, one having skill in the art will understand that the heater 108 is not required for the system 100 but is configured to make the operation of system 100 more efficient.

The heater 108 may heat the air using any of a number of different sources. The heater 108 may generate heat specifically to heat the air. In some embodiments, the heater 108 may be a gas-fired heater, a hydrogen-fired heater or thermal generator, an electric heater, or any other suitable heater that is configured to heat the air from the battery 107. In other embodiments, the heater 108 may be supplied heat from a heat source 122 of the system 100. The heat source 122 of the system 100 is discussed in further detail below. When the heater 108 uses heat generated by the heat source 122, the heater takes advantage of energy that would otherwise by wasted. As discussed in further detail below, the heat source 122 may be the servers, computer systems and other electronic devices of a data center that output heat during operation. The heat output by such a heat source would typically be lost during operation of the data center. The heater 108 may use the heat generated by the heat source 122 to heat the liquified air to convert the liquified air to a gaseous state. Thus, the heater 108 is configured to make the system 100 more efficient by effectively using energy of the system that would otherwise be lost.

In embodiments where the mechanical battery 107 stores liquified air, the gasification of the liquified air results in an increase in pressure of the gaseous air due to the liquid expanding to a gaseous state. The air released from the battery 107 is released as liquified air at approximately atmospheric pressure. The liquified air is then heated to be converted to a gaseous state either solely with atmospheric heat or with the heater 108. During this heating process, the liquified air turns to a gaseous state and becomes pressurized above atmospheric pressure. The pressurized, or compressed, gaseous air is then supplied to the power supply system 109.

The power supply system 109 receives mechanical energy from the mechanical battery 107 and converts the mechanical energy to electrical energy. In various embodiments, the power supply system 109 provides uninterruptible or nearly-uninterruptible power supply to the electrical load 120. As used herein, uninterruptible or nearly-uninterruptible and derivatives thereof refer to a power supply that provides a constant power level within a time period on the order of milliseconds from when a backup power supply is needed and/or activated. In various embodiments, the power supply system 109 provides consistent power to the load 120 and includes mechanical energy storage mechanisms, such as a flywheel or chemical battery in combination or individually, as a backup instance of near-instantaneous power to provide uninterruptible or nearly-uninterruptible power supply, for example, in the event of power loss. In some embodiments, during periods of time where the electrical energy is not readily available and/or cost efficient, or when there is a failure of a primary energy source, the computing device 104 may determine to discharge and convert the stored mechanical energy in the battery 107 to electrical energy to power (and in some embodiments, cool) the electrical load 120. For example, the computing device 104 may, based on comparison of the availability, reliability, and/or price of the electrical energy to one or more baseline or threshold levels, determine to convert the stored potential mechanical energy into electrical energy to power the load 120. For example, the computing device 104 may be connected to and cause the power supply system 109 to discharge and convert the mechanical energy to electrical energy to supply the load 120.

In various embodiments, the power supply system 109 includes a compressed air-powered power generation unit configured to use the compressed air to create electrical energy. In various embodiments, the power supply system 109 includes a turboexpander or an expander turbine 110 coupled to a generator to convert the mechanical energy of the compressed air to electrical energy. The power supply system 109 is not limited to the stated embodiments. Other embodiments of the power supply system 109 could be used without departing from the scope of this disclosure.

The electrical load 120 may be supplied with electrical energy from the power supply system 109. As previously discussed, the electrical load 120 may also be supplied with electrical energy that is created directly by the power source 101 from the metering device 103 or from a utility power grid. The electrical load 120 may be any component that consumes electrical energy. The electrical load 120 may be a building that houses electronic devices, such as a data center. Other embodiments of the electrical load 120 could be used without departing from the scope of this disclosure.

The heat source 122 may be a power-dense environment which outputs heat. The power-dense environment may be part of the electrical load 120. For example, when the electrical load 120 is a data center, as described above, the heat source 122 may be the servers, computer systems and other electronic devices of the data center that output heat during operation. Other embodiments of the heat source 122 could be used without departing from the scope of this disclosure.

The heat source 122 may be cooled by an exhaust of the power supply system 109. For example, when the power supply system 109 includes a compressed air-powered turbine 110, as described above, the turbine 110 converts compressed air from the mechanical battery 107 to electrical energy. In the process of converting the compressed air to electrical energy, the turbine 110 exhausts cold air. The cold air exhausted by the turbine 110 may be supplied to the heat source 122 to cool the heat source 122. The cooling can be performed directly or indirectly. An example of direct cooling is simply injecting the air from the exhaust of the turbine 110 or an upstream heat exchanger to the data center through one or more air ducts. An example of indirect cooling is cooling a fluid through a coil that is pumped to a cooling system of the data center, which cools the data center through the use of existing fans via cooling from the fluid circulated from the turbine 110 or upstream heat exchanger byproduct. In some embodiments, the fluid is a non-freezing fluid at temperatures of, e.g., −128° F. to −6° F. Thermal energy from the data center hot aisle air can be transferred to the non-freezing fluid. Thus, the fluid can be used as a thermal conduit. Other embodiments of cooling the heat source 122 could be used without departing from the scope of this disclosure.

The heat source 122 may be cooled by a thermal capture cooling process from liquid or compressed air cold thermal content extracted in the heat transfer byproduct at the heater 108 upstream of the power supply system 109. A byproduct of heating liquid air is a significant thermal mass of cold air or cold fluid remaining after the heating or heat exchange process boil the cryogenic due to the extreme temperature difference of the liquid air (e.g., approximately −320° F. at or near atmospheric pressure and 32° F. or greater ambient air or fluid temperature).

For example, when compressed air is the energy source, the Joule-Thomson Effect, which describes the change in temperature of a gas as it experiences a rapid change in pressure, comes into effect. During the decompression from the storage pressure in the mechanical battery 107 (e.g., 4000 psi) to the working pressure at the turbine 110 (e.g., 600 psi), the air temperature will quickly drop. The heater 108 can be used to raise the air temperature to ambient temperature (e.g., greater than 32° F.) to prevent freezing of any water molecules that may have be present in the compressed air. The byproduct of raising and maintaining the compressed air temperature above 32° F. is cold air from air-to-air heat exchange or cold fluids from air-to-fluid heat exchange upstream of the turbine 110. The cold thermal liquid or air cooling solution for use at the heat source 122 may be derived from the byproduct at this point.

Figure 2:
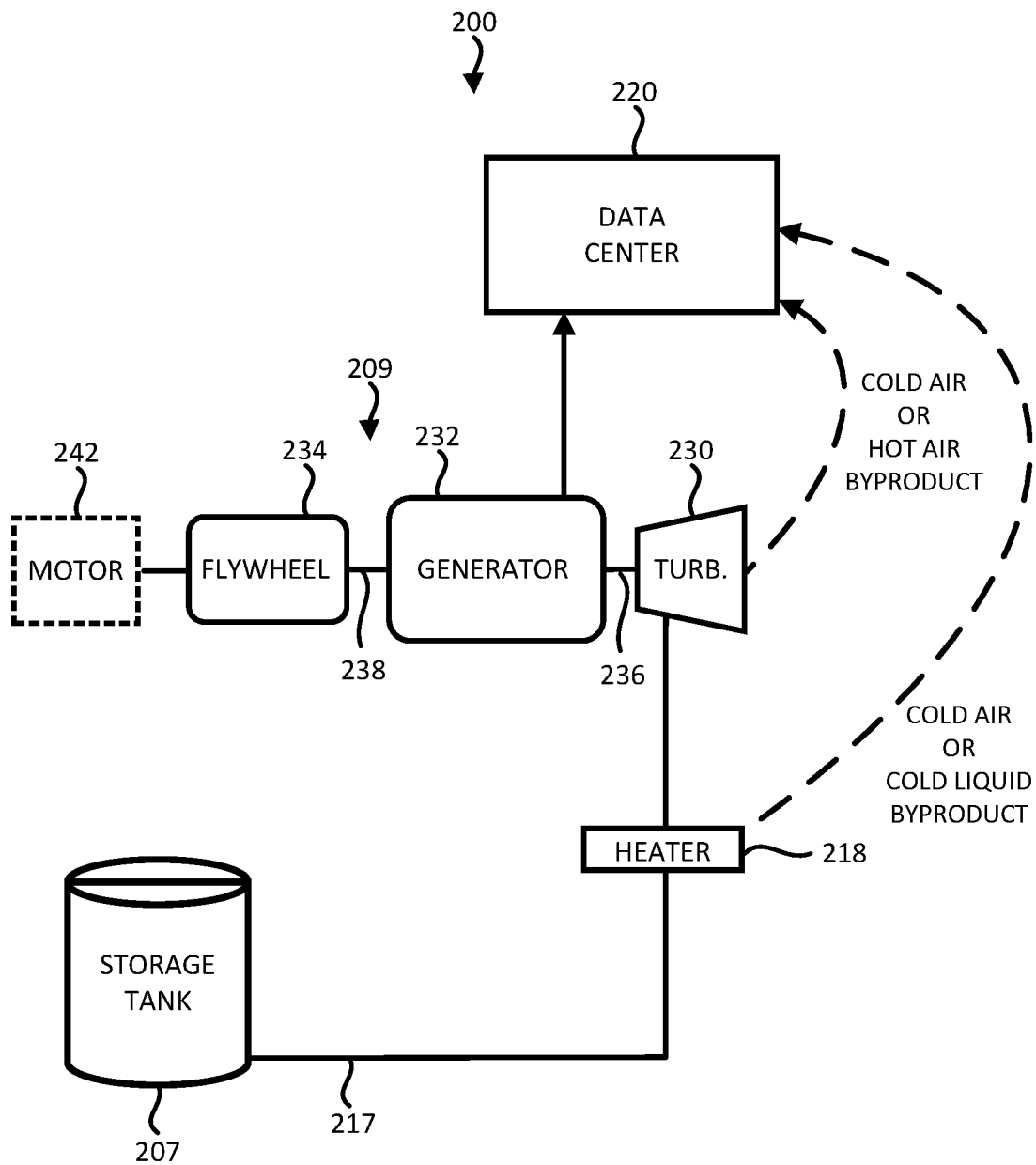
FIG. 2 illustrates an example of a power supply system according to various embodiments of the present disclosure.

FIG. 2 illustrates an example of a power supply system 209 of a power supply and cooling system 200 according to various embodiments of the present disclosure. The power supply system 209 is one example implementation of the power supply system 109 of FIG. 1 and the power supply and cooling system 200 in FIG. 2 is one example implementation of the system 100 of FIG. 1. The embodiment of the power supply system 209 shown in FIG. 2 is for illustration only. Other embodiments of the power supply system 209 could be used without departing from the scope of this disclosure.

As illustrated in FIG. 2, the power supply system 209 includes a turbine 230, a generator or alternator 232 (herein referred to as simply "generator"), and a flywheel 234 (or, in various embodiments, chemical battery individually or in combination with the flywheel 234) to supply power to a data center 220. As discussed in greater detail below, compressed air from a storage tank 207 may be supplied to the turbine 230 through a supply line 217. The turbine 230 is powered by the compressed air to spin a shaft coupled with the generator 232. The generator 232 is configured to convert the mechanical energy created by the turbine 230 into electrical energy. Specifically, the rotor of the generator 232 may be coupled to a spinning shaft 236 of the turbine 230 to generate electrical energy.

In various embodiments, the shaft 236 of the turbine 230 may also be coupled to the flywheel 234, such that the turbine 230, the generator 232, and the flywheel 234 are on a common shaft or axis (236 and 238). In some embodiments, the turbine 230, the generator 232, the flywheel 234, and the shaft(s) 236, 238 can be oriented along a horizontal axis. However, this disclosure is not limited to horizontal arrangements. For example, in some embodiments, one or more of these components, including the flywheel 234 and the shaft(s) 236, 238, can be oriented vertically. In some embodiments, one or more of the turbine 230, the generator 232, the flywheel 234, and the shaft(s) 236, 238 can be assembled or arranged on a linear skid. In some embodiments, the turbine 230 and the flywheel 234 can be configured as a discrete assembly capable of being separately added or removed from the power supply and cooling system 200 for the purpose of retrofit to an existing combustion engine power generating platform. In some embodiments, the turbine 230 and the generator 232 are configured with a vertically arranged flywheel 234 that is independent of the horizontal shaft 236, with power transfers performed through one or more other devices (e.g., static transfer switches, automatic transfer switches, a chemical battery, or the like or any combination thereof).

The spinning shaft 236 of the turbine 230 may spin the shaft 238 of the flywheel 234. The mechanical energy supplied to the turbine 230 can be stored in the momentum of the spinning flywheel 234. In some embodiments, small amounts of electrical energy or small amounts of compressed or liquid air can keep the turbine 230, the generator 232, and the flywheel 234 spinning. Accordingly, as will be discussed in greater detail below, if the turbine 230 ever ceases to provide mechanical energy to the generator 232 or if an alternate power source, such as power source 101, which is powering the data center 220, fails or is desired to be turned off, the mechanical energy stored in the momentum of the spinning flywheel 234 can be used to power the generator 232 so that the generator 232 can continue to generate electrical energy even when the turbine 230 is not in operation or is operating at reduced speed, for example, during start up or switch over. That is, the flywheel 234 keeps the common shaft 236, 238 spinning long enough to have the air valve open and the turbine 230 once again provide the power to rotate the common shaft 236, 238.

Additionally or alternatively, in some embodiments, the system 200 can include a belted or geared electric motor 242 that can rotate the common shaft 236, 238 during non-production periods to provide a spinning soft start via a predetermined minimum spinning rate as discussed in greater detail below.

In various embodiments, the rotating element of the turbine 230, generator 232, and flywheel 234 may be rotationally supported by magnetic bearings or other low friction bearings. The magnetic bearings increase the efficiency of the components and also reduce the required maintenance to the components when compared to traditional bearings. For example, regardless of whether the power supply system 209 is being used as a power source for the data center 220, the turbine 230 and the flywheel 234 (and, in some embodiments, also the generator 232) may continue to rotate so as to provide instantaneous or near-instantaneous back up power in the event of failure of or switch over from the primary power source (e.g., power source 101). The use of magnetic bearings in these embodiments can allow for this consistent rotation to be feasible with reduced maintenance costs.

As such, in various embodiments, the power supply system 209 may be used as an uninterruptible power supply to the data center 220. Uninterruptible power supplies are used to condition and/or provide power to a load when a main source of power fails. Uninterruptible power supplies may supply near-instantaneous protection from input power interruptions. Accordingly, uninterruptible power supplies may be configured to provide power to a load within a certain amount of time after detecting that a main power source has failed in providing power to the load.

Figure 3:
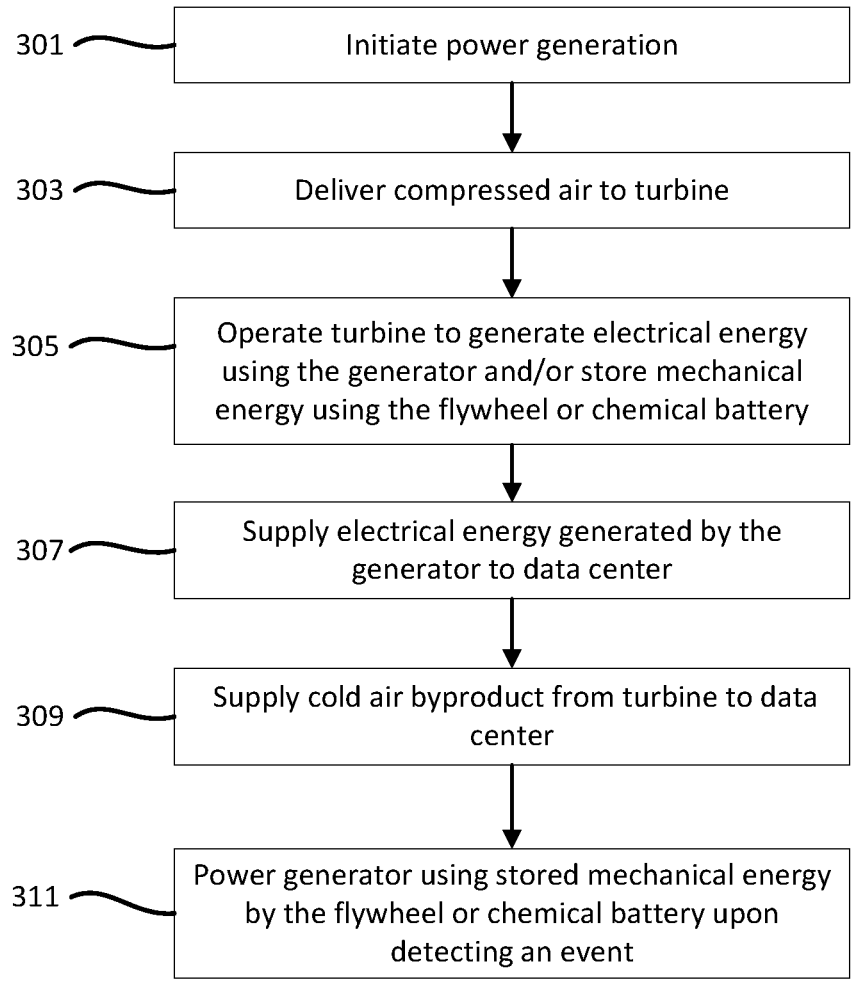
FIG. 3 is a flowchart illustrating an example of operation of a power supply system according to various embodiments of the present disclosure.

FIG. 3 is a flowchart illustrating an example of operations of the power supply and cooling system 200 according to various embodiments of the present disclosure. This embodiment shown in FIG. 3 is for illustration only. Other embodiments of power supply system operation could be used without departing from the scope of this disclosure.

Referring to FIG. 3, in operation 301, the system 200 first determines that power generation via the power supply system 209 is to be initiated. As will be discussed in greater detail below, the determination made in operation 301 may be made by a computing device 600 of the system 200. As will be discussed in greater detail below, the system 200 may determine when to initiate the power generation via the power supply system 209 based on a number of different factors that result in advantageous scenarios. In some embodiments, the power supply system 209 may be in operation constantly or near constantly, such that operation 301 may be rarely performed.

The storage tank 207 may include the mechanical battery 107 of FIG. 1. The storage tank 207 may be filled with air processed by the electrical-to-mechanical energy conversion device 105. In some embodiments, the electrical-to-mechanical energy conversion device 105 may be an air compressor configured to compress air. In these embodiments, the storage tank 207 may be configured to store the compressed air compressed by the air compressor. Accordingly, the mechanical energy stored by storage tank 207 may store air that is compressed to have a pressure that is greater than atmospheric pressure.

In other embodiments, the electrical-to-mechanical energy conversion device 105 may be a gas-to-liquid conversion system configured to convert ambient air of the system to liquified air. The gas-to-liquid conversion system may liquify any liquifiable gas. In one embodiment, the gas-to-liquid conversion system may convert ambient air of the system to a liquid. The gas-to-liquid conversion system may liquify any liquifiable gas without departing from the scope of this disclosure. The gas-to-liquid conversion system may incorporate any known gas liquefaction system. For example, the gas-to-liquid conversion system may operate a Linde-Hampson cycle to convert gas to a liquid. The gas-to-liquid conversion system may repeatedly perform a cycle of compressing, cooling, and expanding air to reduce the temperature of the air and liquify the air. The gas-to-liquid conversion system may incorporate other methods of liquifying gas without departing from the scope of the scope of this disclosure.

In these embodiments, the liquified air from the gas-to-liquid conversion system may be delivered to the storage tank 207 by a liquid line connecting a liquid outlet of the gas-to-liquid conversion system and an inlet of the storage tank 207. One having skill in the art will recognize the storage tank 207 may include any number of storage tanks and is not limited to a single storage tank. Specifically, the storage tank 207 may be configured to store the liquified air at atmospheric pressure. To store the liquified air at atmospheric pressure, the storage tank 207 must keep the liquified air below the temperature at which liquified air converts to its gaseous state (e.g., approximately −320 degrees Fahrenheit at atmospheric pressure). Accordingly, the liquid storage tank 207 may be insulated and may include refrigeration systems to ensure that the liquified air is kept in a liquid state within the storage tank 207. One having skill in the art will recognize that the storage tank 207 may be used in any size, shape, or quantity according to the specific operations of the system 200. In yet other embodiments, the power supply system 209 may be supplied via both of liquid and compressed air energy storage.

In operation 303, the air stored in the storage tank 207 may be delivered from an outlet of the storage tank 207 to the power supply system 209 via the supply line 217. According to various embodiments, the power supply system 209 may be configured to generate electrical power using compressed air. In embodiments where the storage tank 207 stores compressed air, the supply line 217 may supply the compressed air stored in the storage tank 207 to the power supply system 209.

In embodiments where the storage tank 207 stores liquified air, the liquified air stored in the storage tank 207 may be converted to compressed air before being delivered to the power supply system 209. A heater 108, as described in FIG. 1, may be used to heat the liquified air to convert (e.g., boil) the liquified air back to a gaseous state. In various embodiments the heater 108 may not be required for the gasification of the liquified air stored in storage tank 207. For example, liquified air may be stored in the storage tank 207 below the temperature at which liquified air converts to its gaseous state (e.g., approximately −320 degrees Fahrenheit at atmospheric pressure). The heat from the ambient surroundings will convert liquified air to a gaseous state. In this example, the heater 108 is configured to accelerate the conversion of liquified gas from a liquid to a gas. The gasification of the liquified air results in an increase in pressure. Accordingly, the air supplied to the power supply system 209 is compressed air and can be used to power the power supply system 209.

In operation 305, the power supply system 209 may use the compressed air from the storage tank 207 to spin the turbine 230 and therefore generate electrical energy using the generator 232 and/or store mechanical energy using the flywheel 234 (or chemical battery). In operation 307, the electrical energy created by the generator 232 may be supplied to the data center 220 to power the electrical devices of the data center 220.

The data center 220 may include the electrical load 120 and heat source 122 of FIG. 1. In various embodiments, a byproduct of the operation of the turbine 230 is cold air (or in some cases hot air). As the compressed air supplied to the turbine 230 is decompressed, the air cools and is exhausted from the turbine 230. In operation 309, the cold air byproduct of the turbine 230 can be supplied to the heat source 122 in the data center 220. For example, the data center 220 may house computer systems and other associated electronic devices. The computer systems and electronic devices of the data center can be powered by the generator 232, as previously discussed. While operating, the computer systems and electronic devices of the data center 220 may generate a substantial amount of heat and may need to be cooled to ensure proper operation of the computer systems. In operation 309, while being powered by electrical energy created by the generator 232 in operation 307, the computer systems and electronic devices of the data center 220 may be cooled by the cold air byproduct exhausted by the turbine 230. In this way, the power supply system 209 both powers and cools the computer systems and electronic devices of the data center 220.

In other embodiments, the byproduct of the operation of the turbine 230 may be hot air. For example, to improve efficiency of the turbine 230 the cold air supplied from the tank 207 may be heated, for example, using heat from the data center 220 as discussed above, from stored heat that was produced during the process of compression and/or liquefaction of the air the via the electrical-to-mechanical energy conversion device 105, and/or by external heating sources. The heating may occur in several stages to ultimately produce hot air that may more efficiently generate rotation of the turbine 230. As a result, the byproduct of the operation of the turbine 230 may be hot air which may be stored, conveyed (e.g., to provide district heating or via an absorption chiller), or emitted.

In various embodiments the efficiency of the liquid air and compressed air is improved by adding thermal content (e.g., heat) to the material to reduce the mass flow rate of the product entering the turbine 230 upstream in the process. This added heat results in higher exhaust air temperatures at the turbine 230. The higher exhaust temperatures may not be at the prescribed entering air or fluid temperatures for the data center 220.

In this situation, the thermal cooling solution for the data center 220 from liquid or compressed air may be extracted in the heat transfer at the heater 108 upstream of the power system 109. Due to the extreme temperature difference between the liquid air (e.g., approximately −320° F. at or near atmospheric pressure) and ambient air (e.g., 32° F. or below freezing), less than 32° F. thermal content of compressed air during decompression, through the Joule-Thomson Effect (which describes the change in temperature of a gas as it experiences a rapid change in pressure), upstream of the turbine 230 the cooling solution for the data center 220 may be derived from the liquid or air byproduct at this point.

Cooling of the data center 220 can be provided through the turbine 230 exhaust by-product or the cold liquid or air by-product from a heater (or heat exchanger) 218 that is disposed upstream of the power system 109. The output, byproduct, of the heater 218 can still meet the prescribed entering cooling temperature of the data center 220

In operation 311, the power supply system 209 uses the stored mechanical energy by the flywheel 234 (or chemical battery) to (at least in part) generate electrical energy at the generator 232 upon detecting an event. For example, in some embodiments, the event may be the system 200 detecting that the turbine 230 cannot fully power the generator 232. In these embodiments, the power supply system 209 may be a primary power source for the data center 220. In these embodiments, the power supply system 209 may continually be in operation to supply the data center 220 with electrical power and with cooling. The stored mechanical energy of the spinning flywheel 234 (in the form of angular momentum) may be used to generate electrical energy at the generator 232, which can in turn be provided to the data center 220. This helps to ensure that power supplied to the data center 220 remains constant in the event the turbine 230 ever ceases to operate properly, for example, due to a lack of stored compressed and/or liquid air in tank 207, switching from the power supply system 209 being the power primary source for the data center 220, a sudden increase in amount of power needed by the data center 220, a mechanical failure within the system 200, etc.

In another example, the event may be the system 200 detecting a switch over or failure of a primary power source (e.g., such as the power source 101) for the data center 220. In these embodiments, the power supply system 209 may be a secondary power source for the data center 220. In these embodiments, the data center 220 may have a primary energy source of electricity, such as electricity from a utility grid. In some embodiments, the power supply system 209 operates to supplement the power supplied to the data center 220 by the utility grid. For example, the utility grid may supply a part of the amount of electrical energy needed to power the data center 220 and the power supply system 209 may generate the remaining amount of electrical energy needed to power the data center 220.

When the power supply system 209 is used as an uninterruptible power supply, and power is supplied to the data center 220 by a primary power source other than power supply system 209, the power supply system 209 may operate as necessary to keep the flywheel 234 spinning with sufficient mechanical energy to power the generator 232 for a sufficient time to power the data center until the turbine 230 can be fully activated to power the generator 232. For example, it may take a few (e.g., three) seconds after the system 200 detects a primary power loss to the data center 220 before the turbine 230 can brought up to a speed in which it and the generator 232 can generate enough power to power the data center 220. Alternatively, if the turbine 230 is already spinning, it may take a few seconds for the air valve to open and sufficiently expand liquid or compressed air through the turbine 230 to produce power. During these few seconds, the flywheel 234 can already be charged with enough mechanical energy to immediately drive the generator 232 to power the data center 220 during the three seconds it takes the turbine 230 to get up to speed. Once the turbine 230 is up to speed, the turbine 230 may be engaged with the generator 232 to drive the generator 232 in supplying electrical energy to the data center.

Figure 4:
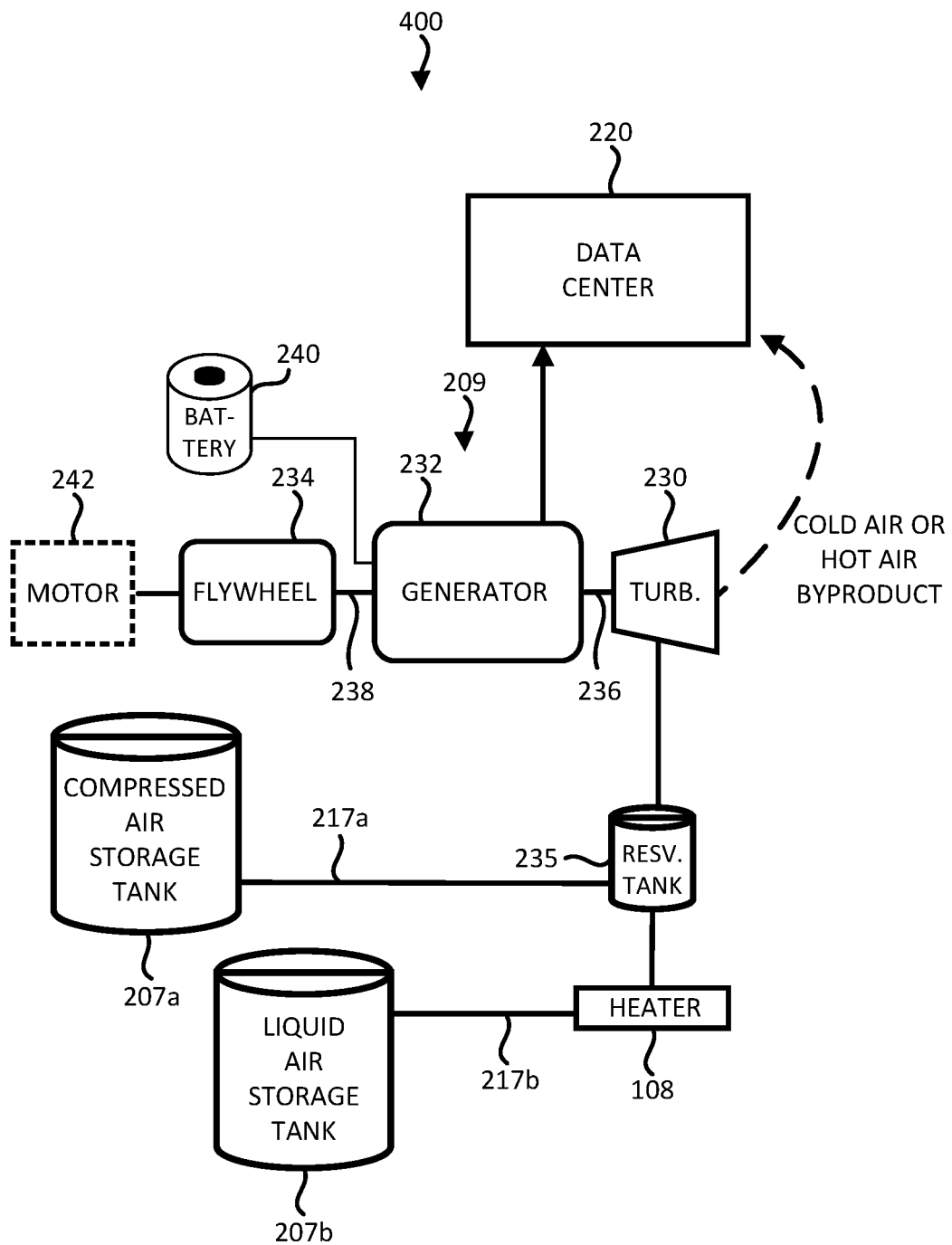
FIG. 4 illustrates another example of power supply system according to various embodiments of the present disclosure.

FIG. 4 illustrates another example of a power supply system 209 of a power supply and cooling system 400 according to various embodiments of the present disclosure. The embodiment of the power supply system 209 shown in FIG. 4 is for illustration only. Other embodiments the power supply system 209 could be used without departing from the scope of this disclosure. The power supply and cooling system 400 in FIG. 4 is one example implementation of the system 100 of FIG. 1.

Referring to FIG. 4, in various embodiments of the disclosure, the power supply system 209 may also include an energy reserve tank 235 and may use a liquid and compressed air energy storage via a compressed air storage tank 207a and a liquid air storage tank 207b. The energy reserve tank 235 may be supplied with air stored in the storage tanks 207a and/or 207b by supply lines 217a and 217b, respectively. The energy reserve tank 235 and storage tanks 207a and/or 207b may be in communication such that the energy reserve tank 235 may be filled with a consistent amount of air. In one example, the pressure within the energy reserve tank 235 may be regulated at 3000 psi. In embodiments where the system 200 uses liquified air, the energy reserve tank 235 may be configured to store a constant volume of liquified air. In embodiments where the system 200 uses compressed air, the energy reserve tank 235 may be in communication with the storage tank 207a so that the energy reserve tank 235 contains compressed air at a constant pressure. Further, in some embodiments, the energy reserve tank 235 may contain a mixture of expanded (e.g., via the heater 108 as discussed above) and liquified air and compressed air or captured boil off air from the liquid air storage tank 207b.

FIG. 4 also illustrates the chemical battery 240, which may be an array of individual batteries, and as discussed before, may in various embodiments be used in addition to or in place of the flywheel 234 to store electrical energy for uninterruptable or near uninterruptable supply of power to the data center 220. In these embodiments, the chemical battery 240 may be charged via the generator 232 in combination with the turbine 230 similarly to the discussion of the storage of mechanical energy in the flywheel 234.

Figure 5:
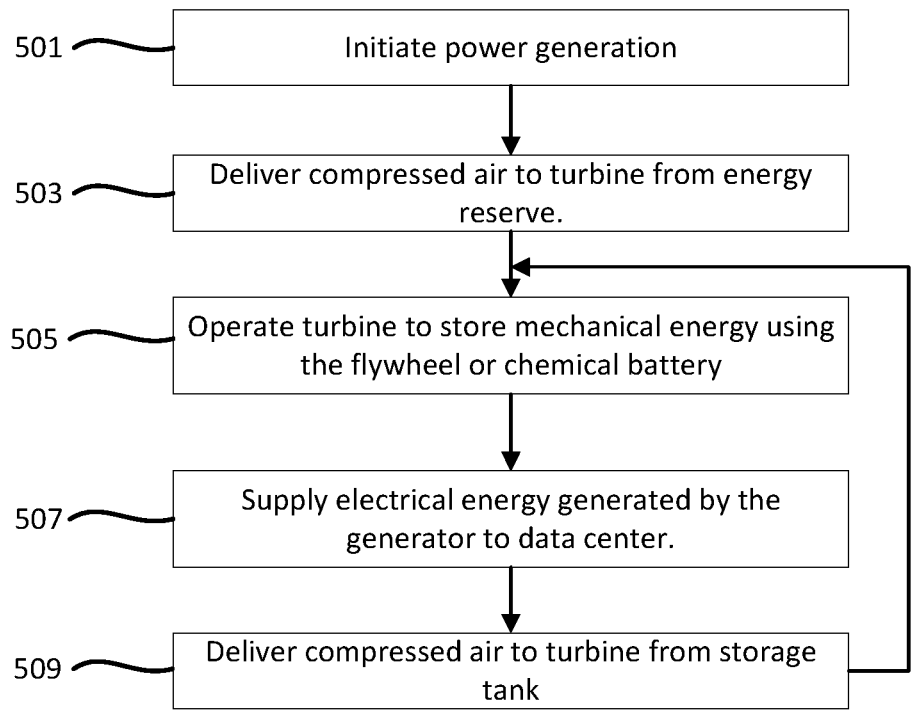
FIG. 5 is a flowchart illustrating another example of operation of a power supply system according to various embodiments of the present disclosure.

FIG. 5 is a flowchart illustrating an example of a turbine operation of the power supply system 209 in the power supply and cooling system 400 of FIG. 4 according to various embodiments of the present disclosure. The embodiment of the operation of the power supply system 209 shown in FIG. 5 is for illustration only. Other embodiments for operation of the power supply system 209 could be used without departing from the scope of this disclosure. One having skill in the art will recognize that some of the components and operations of FIGS. 4 and 5 may be duplicative to the components and operations described in FIGS. 2 and 3. Descriptions of duplicative components and operations will be omitted in describing FIGS. 4 and 5 for brevity.

Referring to FIG. 5, in operation 501, the system 400 initiates power generation as previously described. In operation 503, compressed air is delivered to the turbine 230 from the energy reserve tank 235. In embodiments where the energy reserve tank 235 is supplied with compressed air, the compressed air of the energy reserve tank 235 may be delivered directly to the turbine 230. In embodiments where the energy reserve tank 235 is supplied with liquified air, the liquified air may be heated so that the air expands into compressed air by any of the methods previously discussed before the air is delivered to the turbine 230.

In operation 505, the turbine 230 spins to store mechanical energy in the flywheel 234 (or chemical battery) and may also spin the generator 232. In various embodiments when the power supply system 209 is operated as a backup power source, the turbine 230 is powered via the energy reserve tank 235 to keep the turbine 230 spinning at a predetermined minimum rate even when the turbine 230 is not being used to power the data center 220. In these embodiments, it may be advantageous to use the energy reserve tank 235 to maintain the spinning of the turbine 230 so that, when the power supply system 209 is activated to act as an uninterruptible power supply, the turbine 230 is already spinning and does not have to be started from a completely stopped position. Additionally, maintaining spinning of the flywheel 234 and also the generator 232 may allow for flywheel 234 to engage the generator 232 to spin for sufficiently long enough time to allow the turbine 230 time to reach operational speeds during, for example, a switch over for using the power supply system 209 as the primary power source for the load.

According to various embodiments, the energy reserve tank 235 may be used to keep the turbine 230 and flywheel 234 spinning at a minimum rate and, in some embodiments, also provide cooling to the data center 220 as previously described while the data center 220 is being powered by a primary power source and the storage tank 207 may be used to power the turbine 230 when the power supply system 209 is used to supply power to the data center, as previously described. According to other embodiments, when it is determined that the power supply system 209 needs to be used to power the data center 220, the energy stored in the energy reserve tank 235 may be readily available and may be used to start the operation of the turbine 230. Energy stored in the storage tank 207 may then be used when it becomes available or when the operation of the turbine 230 reaches a certain threshold. For example, once the turbine 230 causes the generator 232 to reach a certain output or once the turbine 230 reaches a certain spinning rate, the turbine 230 may begin being powered by the energy stored in the storage tank 207.

Additionally, or alternatively, in some embodiments, the energy reserve tank 235 may be more easily operated and controlled based on its size and proximity to the turbine 230 when compared to the storage tank 207. Accordingly, the energy reserve tank 235 may be more readily available and better suited to serve as a short-term source of power for the turbine 230 in various scenarios when the turbine 230 requires compressed air quickly.

In operation 507, the generator 232 supplies the electrical energy generated to the data center 220 as previously described. Thereafter, in operation 509, the system 400 may, for a time, supply air to the turbine 230 from both the energy reserve tank 235 and the storage tank 207. The system 400 may eventually stop supplying air to the turbine 230 from the energy reserve tank 235 and deliver air to the turbine 230 from the storage tank 207. In this step, the air that was depleted from the energy reserve tank 235 may also be replenished by the storage tank 207 or may be replenished by a stand alone compressor or compressor that is part of the electrical-to-mechanical energy conversion device 105.

The flowcharts discussed above with regard to FIGS. 3 and 5 illustrate example operations that can be implemented in accordance with the principles of the present disclosure and various changes could be made to the methods illustrated in the flowcharts herein. For example, while shown as a series of steps, various steps in each figure could overlap, occur in parallel, occur in a different order, or occur multiple times. In another example, steps may be omitted or replaced by other steps.

Figure 6:
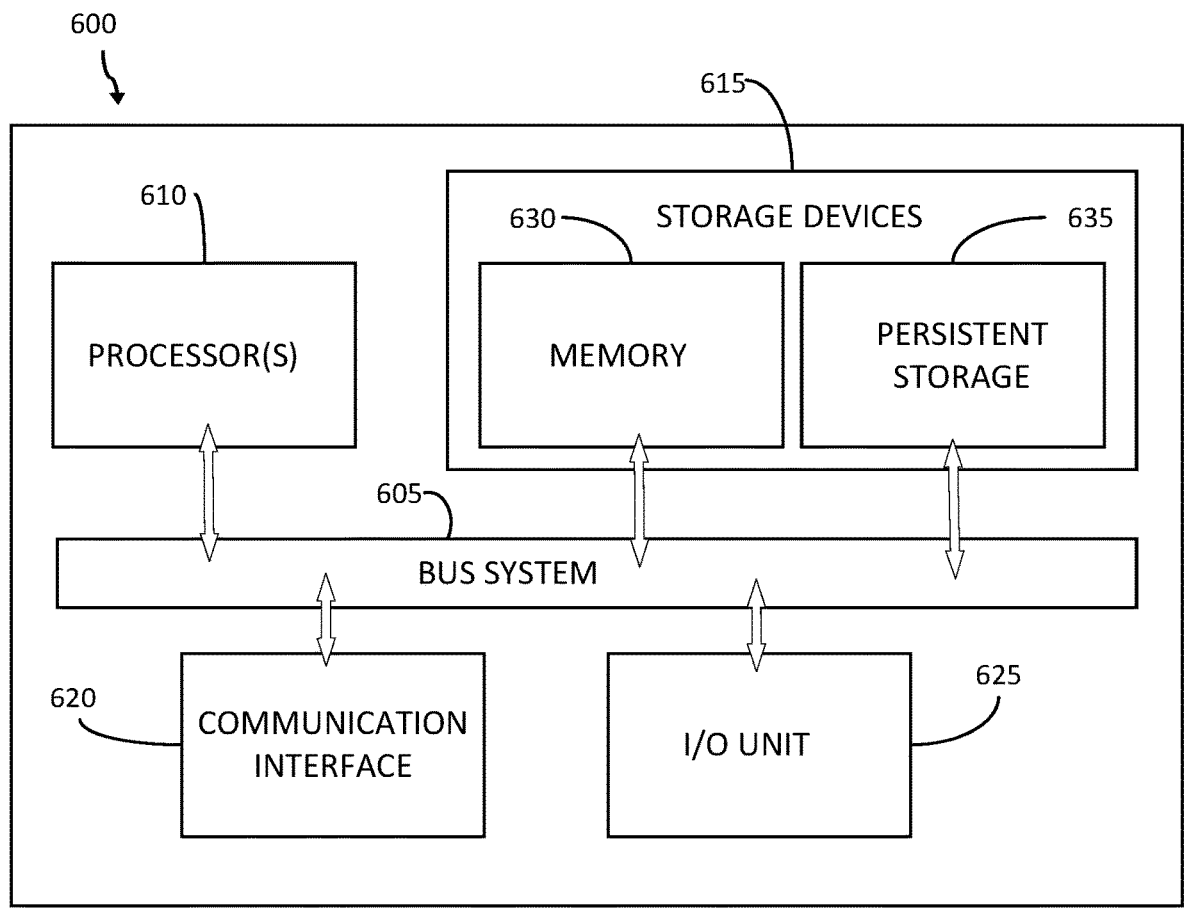
FIG. 6 illustrates an example of a computing device in a power supply and cooling system according to various embodiments of the present disclosure.

FIG. 6 illustrates an example of a computing device 600 in a power supply and cooling system according to various embodiments of the present disclosure. The computing device 600 may be the computing device 104 discussed above in FIG. 1. The computing device 600 can be configured to control the operations discussed in FIGS. 3 and 5 in the systems 200, 400 respectively. The computing device 600 may be programed to control the systems 200, 400 based on a number of different factors already discussed. For example, in controlling performance of operations the discussed in FIGS. 3 and 5, the computing device 600 may consider the price of electrical energy from the associated utility grid, the amount of energy produced by the power source 101, the amount of mechanical energy stored in the storage tank 207, whether the utility grid and/or power source unexpectedly fail to provide electrical energy to the data center 220, an amount of electrical energy needed by the data center 220, and an amount of time it will take the power supply system 209 to get up to speed to generate enough energy to power the data center 220. One having skill in the art will recognize that the computing device 600 of the systems 200, 400 may operate based on factors related to the systems 200, 400 not explicitly listed above.

The computing device 600 may be configured to control the different components of the of the systems 200, 400. For example, the computing device 600 may control or monitor operations associated with the power source 101.

The computing device 600 may control the operation of the metering device 103. For example, the computing device 600 may control how the metering device 103 distributes electrical energy provided to the power source 101 and the utility grid. The computing device 600 may be configured to control the metering device 103 to distribute electrical energy from either the utility grid or the power source 101 to the data center 220 or the electrical-to-mechanical energy conversion device 105 based on any number of factors as discussed above, such as the availability of the renewable energy powering power source, the price of electricity from grid, the amount of potential mechanical energy stored in the storage tank 207, operability of the power supply system 209, if a power failure is detected, an amount of electrical energy needed by the data center 220, or any other factors that may related to the operation and efficiency of the systems 200, 400.

The computing device 600 may control the operation of the electrical-to-mechanical energy conversion device 105. For example, the computing device 600 may control whether the electrical-to-mechanical energy conversion device 105 is in operation.

The computing device 600 may control operations of the storage tank 207. For example, the computing device 600 may control valves associated with the storage tank 207 to allow processed air into the storage tank 207 or release air from the storage tank 207. The computing device 600 may also read sensor readings related to the storage tank 207. For example, the computing device 600 may determine pressures and temperatures of the storage tank 207 from pressure and temperature sensors associated with the storage tank 207. In embodiments where the storage tank 207 stores liquified air, the computing device 600 may determine a volume of liquid stored in the storage tank 207 using liquid level sensors associated with the storage tank 207.

The computing device 600 may be configured to control the heater 108. For example, the computing device 600 may control whether the heater 108 is turned off or on. The computing device 600 may control an amount of heat output from the heater 108. When the heater 108 uses heat generated by the data center 220, the computing device 600 may control how and when the heat is transferred from the data center 220 to the heater 108.

The computing device 600 may control the power supply system 209. For example, the computing device 600 may control whether the power supply system 209 is turned off or on. The computing device 600 may control an amount of electrical energy output from the power supply system 209.

The computing device 600 may control whether the power supply system 209 is a primary power source to the data center 220, a supplementary power source to the data center 220, or an uninterruptible power supply to the data center 220. Further, the computing device 600 may control the individual components of the power supply system 209 such as the turbine 230, the generator 232, the flywheel 234 and the energy reserve tank 235. The computing device 600 may control the system 200 based on detected power needs of the data center 220.

As shown in FIG. 6, the computing device 600 includes a bus system 605, which supports communication between processor(s) 610, storage devices 615, communication interface (or circuit) 620, and input/output (I/O) unit 625. The processor(s) 610 executes instructions that may be loaded into a memory 630. The processor(s) 610 may include any suitable number(s) and type(s) of processors or other devices in any suitable arrangement. Example types of processor(s) 610 include microprocessors, microcontrollers, digital signal processors, field programmable gate arrays, application specific integrated circuits, and discrete circuitry.

The memory 630 and a persistent storage 635 are examples of storage devices 615, which represent any structure(s) capable of storing and facilitating retrieval of information (such as data, program code, and/or other suitable information on a temporary or permanent basis). The memory 630 may represent a random access memory or any other suitable volatile or non-volatile storage device(s). The persistent storage 635 may contain one or more components or devices supporting longer-term storage of data, such as a read-only memory, hard drive, Flash memory, or optical disc. For example, persistent storage 635 may store one or more databases of data, standards data, results, data, client applications, etc.

The communication interface 620 supports communications with other systems or devices. For example, the communication interface 620 could include a network interface card or a wireless transceiver facilitating communications over the system 200 or system 100. The communication interface 620 may support communications through any suitable physical or wireless communication link(s). The I/O unit 625 allows for input and output of data. For example, the I/O unit 625 may provide a connection for user input through a keyboard, mouse, keypad, touchscreen, or other suitable input devices. The I/O unit 625 may also send output to a display, printer, or other suitable output devices.

Although FIG. 6 illustrates one example of a computing device 600, various changes may be made to FIG. 6. For example, various components in FIG. 6 could be combined, further subdivided, or omitted and additional components could be added according to particular needs. As a particular example, while depicted as one system, the computing device 600 may include multiple computing systems that may be remotely located. In another example, the computing device 600 may be a personal electronic device, such as, a phone, tablet, or laptop, or provide or update a user interface, e.g., via a software application, or other communications interface to a personal electronic device for control, management, information, and or access to the computing device 600 and/or any aspects of the system 100.

It may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "such as," when used among terms, means that the latter recited term(s) is(are) example(s) and not limitation(s) of the earlier recited term. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

Moreover, various functions described herein can be implemented or supported by one or more computer programs, each of which is formed from computer readable program code and embodied in a computer-readable medium. The terms "application" and "program" refer to one or more computer programs, software components, sets of instructions, procedures, functions, objects, classes, instances, related data, or a portion thereof adapted for implementation in a suitable computer readable program code. The phrase "computer-readable program code" includes any type of computer code, including source code, object code, and executable code. The phrase "computer-readable medium" includes any type of medium capable of being accessed by a computer, such as read-only memory (ROM), random access memory (RAM), a hard disk drive, a compact disc (CD), a digital video disc (DVD), or any other type of memory. A "non-transitory" computer-readable medium excludes wired, wireless, optical, or other communication links that transport transitory electrical or other signals. A non-transitory, computer-readable medium includes media where data can be permanently stored and media where data can be stored and later overwritten, such as a rewritable optical disc or an erasable memory device.

Definitions for other certain words and phrases are provided throughout this patent document. Those of ordinary skill in the art should understand that in many if not most instances, such definitions apply to prior as well as future uses of such defined words and phrases. Although the present disclosure has been described with an exemplary embodiment, various changes and modifications may be suggested to one skilled in the art. It is intended that the present disclosure encompass such changes and modifications as fall within the scope of the appended claims. None of the description in this application should be read as implying that any particular element, step, or function is an essential element that must be included in the claim scope. The scope of the patented subject matter is defined by the claims.

What is claimed is:

1. A system comprising:
   at least one storage tank configured to store at least one of first compressed air or liquid air; and
   a power supply system comprising a turbine, a generator, and a flywheel, the power supply system configured to:
   receive second compressed air from the at least one storage tank, wherein the second compressed air comprises either the first compressed air or the liquid air which has been heated into a gaseous state;
   spin the turbine and the flywheel using the second compressed air, wherein the spinning of the turbine generates electrical energy at the generator;
   provide the electrical energy to a data center for powering electronic devices of the data center; and
   provide at least a portion of the second compressed air exhausted by the turbine to the data center for cooling the electronic devices of the data center.

2. The system of claim 1, wherein the power supply system is further configured to:
   provide cold thermal content from at least a portion of the first compressed air or the liquid air directly to the data center through a heater or a heat exchanger disposed prior to the turbine.

3. The system of claim 1, wherein the power supply system is further configured to:
   in response to detection of an event, use angular momentum of the flywheel to generate electrical energy.

4. The system of claim 1, wherein the turbine, the generator, and the flywheel are coupled to each other on a common shaft.

5. The system of claim 4, further comprising:
   a motor configured to rotate the common shaft at a predetermined minimum spinning rate during a non-production period of the power supply system.

6. The system of claim 1, further comprising:
   a heater configured to heat the liquid air or the first compressed air from the at least one storage tank into the second compressed air before the second compressed air is provided to the power supply system.

7. The system of claim 6, wherein the heater uses heat generated by the electronic devices of the data center.

8. The system of claim 1, wherein the turbine and the flywheel are configured as a discrete assembly capable of being separately added to or removed from the power supply system.

9. The system of claim 1, wherein the power supply system is configured to supply power to the data center as an uninterruptible power supply (UPS) when a main power source is unavailable.

10. A method comprising:
    storing at least one of first compressed air or liquid air in at least one storage tank;
    receiving, at a power supply system comprising a turbine, a generator, and a flywheel, second compressed air from the at least one storage tank, wherein the second compressed air comprises either the first compressed air or the liquid air which has been heated into a gaseous state;
    spinning the turbine and the flywheel using the second compressed air, wherein the spinning of the turbine generates electrical energy at the generator;
    providing the electrical energy to a data center for powering electronic devices of the data center; and
    providing at least a portion of the second compressed air exhausted by the turbine to the data center for cooling the electronic devices of the data center.

11. The method of claim 10, further comprising:
    providing cold thermal content from at least a portion of the first compressed air or the liquid air directly to the data center through a heater or a heat exchanger disposed prior to the turbine.

12. The method of claim 10, further comprising:
    in response to detection of an event, using angular momentum of the flywheel to generate electrical energy.

13. The method of claim 10, wherein the turbine, the generator, and the flywheel are coupled to each other on a common shaft.

14. The method of claim 13, further comprising:
operating a motor to rotate the common shaft at a predetermined minimum spinning rate during a non-production period of the power supply system.

15. The method of claim 10, further comprising:
heating the liquid air or the first compressed air from the at least one storage tank into the second compressed air before the second compressed air is provided to the power supply system.

16. The method of claim 15, wherein the liquid air or the first compressed air is heated using heat generated by the electronic devices of the data center.

17. The method of claim 10, wherein the turbine and the flywheel are configured as a discrete assembly capable of being separately added to or removed from the power supply system.

18. The method of claim 10, further comprising:
supplying power to the data center from the power supply system, operating as an uninterruptible power supply (UPS), when a main power source is unavailable.

19. A non-transitory computer readable medium embodying a computer program, the computer program comprising computer readable program code that, when executed by a processor of a computing device, cause the computing device to:

control at least one storage tank to store at least one of first compressed air or liquid air in at least one storage tank;

control a power supply system to receive second compressed air from the at least one storage tank, wherein the second compressed air comprises either the first compressed air or the liquid air which has been heated into a gaseous state, wherein the power supply system comprises a turbine, a generator, and a flywheel;

control the power supply system to spin the turbine and the flywheel using the second compressed air, wherein the spinning of the turbine generates electrical energy at the generator;

control the power supply system to provide the electrical energy to a data center for powering electronic devices of the data center; and control the power supply system to provide at least a portion of the second compressed air exhausted by the turbine to the data center for cooling the electronic devices of the data center.

20. The non-transitory computer readable medium of claim 19, wherein the computer program further comprises computer readable program code that, when executed by the processor, causes the computing device to:

in response to detection of an event, control the power supply system to use angular momentum of the flywheel to generate electrical energy.

* * * * *